US010429590B1

United States Patent
Lee et al.

(10) Patent No.: US 10,429,590 B1
(45) Date of Patent: Oct. 1, 2019

(54) DAMPING MECHANISM FOR MICRO-ELECTRO-MECHANICAL SYSTEMS (MEMS) STRUCTURES, INCLUDING TILTING MIRROR DEVICES USED IN OPTICAL COMPONENTS

(71) Applicant: DICON FIBEROPTICS, INC., Richmond, CA (US)

(72) Inventors: Ho-Shang Lee, El Sobrante, CA (US); Rong Ping Hsia, Pleasanton, CA (US)

(73) Assignee: DICON FIBEROPTICS, INC., Richmond, CA (US)

( * ) Notice: Subject to any disclaimer, the term of this patent is extended or adjusted under 35 U.S.C. 154(b) by 0 days.

(21) Appl. No.: 16/019,034

(22) Filed: Jun. 26, 2018

Related U.S. Application Data (60) Provisional application No. 62/674,475, filed on May 21, 2018.

(51) Int. Cl.
  *G02B 6/35* (2006.01)
  *B81C 1/00* (2006.01)

(52) U.S. Cl.
  CPC ........ *G02B 6/3584* (2013.01); *B81C 1/00325* (2013.01); *G02B 6/354* (2013.01); *G02B 6/357* (2013.01); *G02B 6/3574* (2013.01)

(58) Field of Classification Search
  CPC ............................ G02B 6/359; B81C 1/00325
  See application file for complete search history.

(56) References Cited

U.S. PATENT DOCUMENTS

| | | | | |
|---|---|---|---|---|
| 5,212,582 A * | 5/1993 | Nelson | ............... | G02B 26/0841 340/815.4 |
| 6,491,404 B2 * | 12/2002 | Hill | ....................... | B81B 3/0051 359/233 |
| 6,535,319 B2 * | 3/2003 | Buzzetta | .............. | G02B 6/2931 359/225.1 |
| 6,614,581 B2 * | 9/2003 | Anderson | ............. | B81B 3/0062 248/487 |
| 6,621,611 B2 * | 9/2003 | Gutierrez | ............. | G02B 6/3564 359/218.1 |
| 6,628,856 B1 | 9/2003 | Costello et al. | | |
| 6,657,759 B2 * | 12/2003 | Muller | .................. | B81B 3/0016 359/199.2 |

(Continued)

*Primary Examiner* — Rhonda S Peace
(74) *Attorney, Agent, or Firm* — Vierra Magen Marcus LLP (57) ABSTRACT

A rotating or tilting MEMS structure, such as a tilt mirror for an optical device, includes a damping mechanism, provided by locating an inlay block structure underneath the MEMS rotating surface. Damping is created by the temporary squeezing or compression of the air, atmosphere, or gas(es) surrounding the MEMS structure, between the underside of the MEMS tilting surface and the top surface of the block. Movement of the MEMS surface away from the top surface of the block will also be damped by the temporary reduction in pressure. The block structure is fabricated separately from the MEMS tilt-mirror structure and located under the MEMS tilt-mirror structure, either before or during the die-attach or die-bonding process. The damping effect serves to minimize and limit the amplitude and duration of oscillatory motion of the MEMS tilt-mirror, following intentional movement of the mirror, or, in response to external shock and vibrational forces.

23 Claims, 5 Drawing Sheets

(56) References Cited

U.S. PATENT DOCUMENTS

| | | | | |
|---|---|---|---|---|
| 6,791,235 | B2* | 9/2004 | Miller | B81C 1/00968 |
| | | | | 310/309 |
| 6,798,942 | B2* | 9/2004 | Freeman | G02B 6/3518 |
| | | | | 385/16 |
| 6,838,738 | B1 | 1/2005 | Costello et al. | |
| 6,900,915 | B2* | 5/2005 | Nanjyo | G02B 26/0841 |
| | | | | 359/224.1 |
| 7,167,290 | B2* | 1/2007 | Katoh | G02B 26/0841 |
| | | | | 359/200.6 |
| 7,508,569 | B2* | 3/2009 | Pan | G02B 26/0841 |
| | | | | 359/290 |
| 7,535,620 | B2* | 5/2009 | Zhou | G02B 26/0841 |
| | | | | 359/290 |
| 7,602,097 | B2* | 10/2009 | Nakamura | B81B 3/0059 |
| | | | | 310/309 |
| 7,646,528 | B2* | 1/2010 | Maeda | G02B 26/0841 |
| | | | | 359/223.1 |
| 9,036,231 | B2* | 5/2015 | Zhou | G02B 26/101 |
| | | | | 359/199.2 |
| 10,197,738 | B2* | 2/2019 | Lee | G02B 26/0808 |
| 2002/0186449 | A1* | 12/2002 | Anderson | G02B 26/0841 |
| | | | | 359/291 |
| 2003/0214639 | A1* | 11/2003 | Patel | B81B 3/0051 |
| | | | | 353/98 |
| 2018/0329147 | A1* | 11/2018 | Lee | G02B 6/3518 |

* cited by examiner

A-A CROSS-SECTION VIEW
Fig. 2B Prior Art

B-B CROSS-SECTION VIEW
Fig. 2C Prior Art

DAMPING MECHANISM FOR MICRO-ELECTRO-MECHANICAL SYSTEMS (MEMS) STRUCTURES, INCLUDING TILTING MIRROR DEVICES USED IN OPTICAL COMPONENTS

PRIORITY CLAIM

This application claims the benefit of U.S. provisional pat. app. 62/674,475, filed May 21, 2018, which is hereby incorporated in its entirety by this reference.

BACKGROUND

This disclosure relates generally to Micro-Electro-Mechanical Systems (MEMS) structures, including tilting mirror devices used in optical components and optical communication networks.

Optical components that switch, attenuate, filter, and process optical signals are widely deployed in optical networks, typically in the 1550 nm or 1310 nm wavelength windows. In many of these optical components, a rotating or tilting mirror is used as a beam-steering element. In these optical components that use tilting mirrors, Micro-Electrical-Mechanical System (MEMS) devices are often used to implement the rotating mirror or tilt-mirror element. In some prior art embodiments, the MEMS rotating mirror or tilt-mirror is fabricated from silicon using semiconductor processing methods and equipment. The mirror can be fabricated as an integral part of the silicon device structure, and is often coated with a thin metallic layer (or layers), using gold, aluminum, or some combination of metal layers to achieve high reflectivity at the appropriate wavelengths.

Prior art optical components that use a rotating or tilting MEMS mirror as a beam-steering element are described in U.S. Pat. Nos. 6,838,738 and 6,628,856, as well as in other patents and literature. The tilt-mirror MEMS structure may have a single rotational axis, or two rotational axes. The moving portions of the MEMS structure are typically suspended from the fixed portions of the structure by structural elements that act as torsion springs or beams. The torsion beams support the moving parts of the structure, and also provide a spring force that resists the tilting or rotating of the moving portions of the structure. In some prior art embodiments, electrostatic actuators are used to tilt the mirror, utilizing multiple groups of comb-finger structures, fabricated in two or more layers of silicon. The MEMS structures may be fabricated from single-layer or double-layer Silicon-On-Insulator (SOI) wafers, with one or two buried oxide layers. In some embodiments, the fabrication process results in a void, or empty space, underneath the rotating or tilting mirror.

The system requirements placed on optical components typically include requirements for resisting external shock and vibrational forces. These external shock and vibrational forces may cause unwanted rotation of tilting of the MEMS mirror, creating a variety of optical impairments. In order to minimize the effects of external shock and vibrational forces, it is desirable for the torsion beams that support the moving portions of the MEMS structure to be as stiff as possible. At the same time, the spring constant of the torsion beams must be low enough to allow sufficient rotation or tilting of the mirror, around one or two axes of rotation, to meet the optical requirements of the component, taking into account the amount of rotational force that can be provided by the electrostatic actuators.

In prior art embodiments where the moving portions of the MEMS structure is supported by torsion beams, acting as springs, the rotational or tilting motion of the mirror will have a resonant frequency for each axis of rotation, determined by the mass of the moving portion of the structure, and the spring constant of the torsion beams. External shock or vibrational forces, as well as intentional movement of the MEMS mirror, may result in oscillatory movement of the MEMS mirror, especially at the resonant frequencies.

SUMMARY

In one set of embodiments, an apparatus includes a Micro-Electro-Mechanical-Systems (MEMS) device, a header, and a block structure. The MEMS device is formed on a substrate and has a movable surface configured to rotate in response to a voltage differential applied to the MEMS device. The MEMS device has a void region formed in the substrate under the movable surface. The header is attached to the MEMS device such that the void region is between the header and the movable surface. The block structure is in the void region and is formed separately from the MEMS device. The block structure is attached to one or both of the header and the MEMS device such that the block structure is proximate to, but not in contact with, the movable surface. The block structure is configured to dampen rotational movement of the moveable surface.

Other embodiments include methods of forming a Micro-Electro-Mechanical-Systems (MEMS) structure, including forming on a substrate a MEMS device having a movable surface configured to rotate in response to a voltage differential applied to the MEMS device, the MEMS device formed to have a void region formed in the substrate under the movable surface. The MEMS device is attached to a header such that the void region is between the header and the movable surface. A block structure formed separately from the MEMS device is located within the void region, where this includes attaching the block structure to one or both of the header and the MEMS device such that the block structure is proximate to but not in contact with the movable surface, and the block structure configured to dampen rotational movement of the moveable surface.

Optionally, in any of the preceding embodiments, the block structure can be formed directly on the header.

Various aspects, advantages, features and embodiments are included in the following description of examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following presents embodiments of a damping mechanism to reduce undesired oscillatory movement in a Micro-Electro-Mechanical-Structures (MEMS) structure. The moving portions of a MEMS structure are supported by torsion beams, acting as springs, and the rotational or tilting motion of the mirror will have a resonant frequency for each axis of rotation, determined by the mass of the moving portion of the structure, and the spring constant of the torsion beams. External shock or vibrational forces, as well as intentional movement of the MEMS mirror, may result in oscillatory movement of the MEMS mirror, especially at the resonant frequencies. In order to minimize the amplitude and duration of this undesired oscillatory movement, a damping mechanism can be introduced.

One method for providing damping of oscillatory movement of the MEMS mirror is to have a solid mass or structural element directly underneath the rotating tilt-mirror, that is located in close proximity to the mirror, just below the full range of motion of the MEMS mirror during operation. As the mirror moves, the air, atmosphere, or gas(es) surrounding the MEMS mirror will be temporarily squeezed or compressed between the MEMS mirror and the mass or structural element that is located below the mirror. This temporary compression of the air, atmosphere, or gas(es) provides a force that resists the motion of the mirror, serving to damp the mirror's motion. This method for creating a damping effect is sometimes referred to as "squeeze-film damping", or "squeeze-air damping". It should also be noted that when the mirror moves in the reverse direction, the movement of the mirror away from the mass or structural element will result in a temporary reduction in pressure of the air, atmosphere or gas(es), that also serves to damp the mirror motion.

Some methods for fabricating rotating or tilting MEMS mirror structures lend themselves to leaving a solid mass or structural element in close proximity to the underside of the MEMS mirror. In particular, fabrication processes that make use of wafer bonding may be suitable. However, in order to avoid the cost and complexity of wafer bonding, some embodiments of MEMS tilt-mirror structures use a backside wafer etching process that leaves a void or empty space under the MEMS tilt-mirror, making it difficult to take advantage of squeeze-film damping.

The embodiments described in the following present a rotating or tilting MEMS mirror or other MEMS structure in which a damping mechanism is provided by locating a separate piece of material, a block structure or inlay block (or simply "block"), directly underneath and in proximity to the tilt-mirror or other movable surface of a MEMS. Damping is created by the temporary squeezing or compression of the air, atmosphere, or gas(es) surrounding the MEMS structure, between the underside of the MEMS tilt-mirror and the top surface of the inlay block structure. The mirror movement in the opposite direction, away from the top surface of the block, will also be damped by the temporary reduction in pressure. The inlay block can be fabricated separately from the MEMS tilt-mirror structure and is located under the MEMS tilt-mirror structure either before or during the die-attach or die-bonding process. In one embodiment, the inlay block is bonded to a chip header, and then the MEMS tilt-mirror structure is placed over the inlay block, and then die-attached or die-bonded to the chip header. In another embodiment, the inlay block is first bonded to the underside of the MEMS tilt-mirror's support structure, and then this combined sub-assembly is die-attached or die-bonded to a chip header. In still other embodiments, the damper block can be built in as a plateau from the header surface. The damping effect serves to minimize and limit the amplitude and duration of oscillatory motion of the MEMS tilt-mirror, following intentional movement of the mirror, or, in response to external shock and vibrational forces.

Figure 1A:
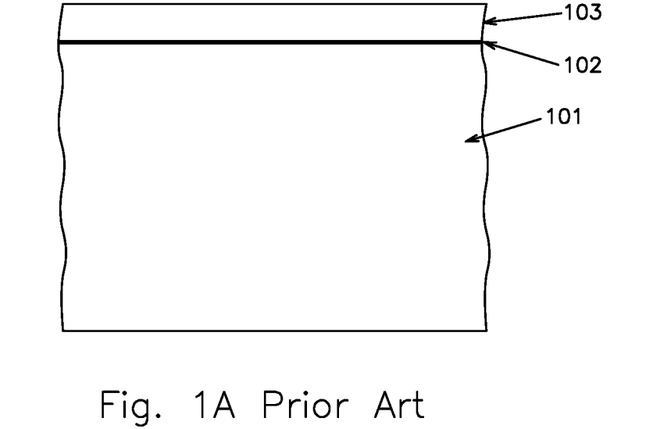
FIGS. 1A and 1B show cross-sectional views of Silicon-On-Insulator (SOI) wafers, with one or two buried oxide layers, respectively.
Figure 1B:
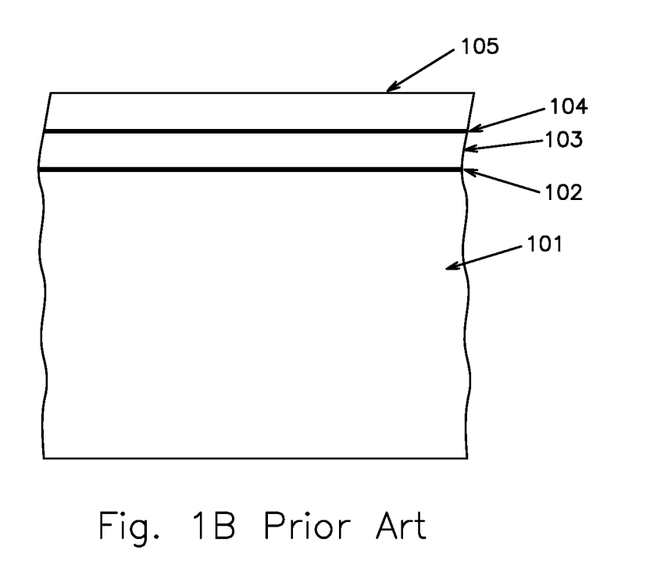

Silicon-on-Insulator (SOI) wafers are often used to fabricate MEMSs as shown in FIGS. 1A and 1B. A thin layer of silicon dioxide 102 (also referred to as a buried oxide layer), with a thickness that can range from sub-micron to a few microns, is laid on the top of a silicon substrate wafer 101 having a thickness of hundreds of microns and a diameter on the order of inches, as shown in FIG. 1A. Then a thin silicon layer 103 (also referred to as Device Layer 1) with a thickness of tens of microns, is laid on the top of silicon dioxide layer 102. The wafer shown in FIG. 1A is called a single-layer SOI wafer. FIG. 1B shows a double-layer SOI wafer. A second layer of silicon oxide 104 (also referred to as buried oxide layer 2) is laid on the top of the first silicon layer 103, and then a second silicon layer 105 (also referred to as device layer 2) is laid on the top of the second silicon oxide layer 104. A double-layer SOI wafer will be used to illustrate embodiments in the following description. However, MEMS devices fabricated from single-layer SOI or even more than two layers, wafers are also within the scope of the techniques described here.

Figure 2A:
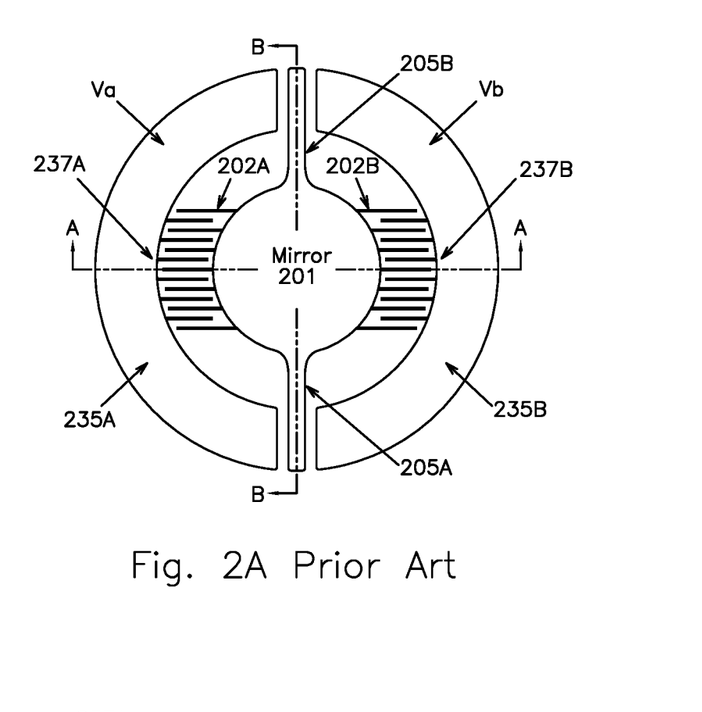
FIG. 2A shows a conceptual top view of a MEMS tilt-mirror structure, with one axis of rotation, utilizing comb finger electrostatic actuators.
Figure 2B:
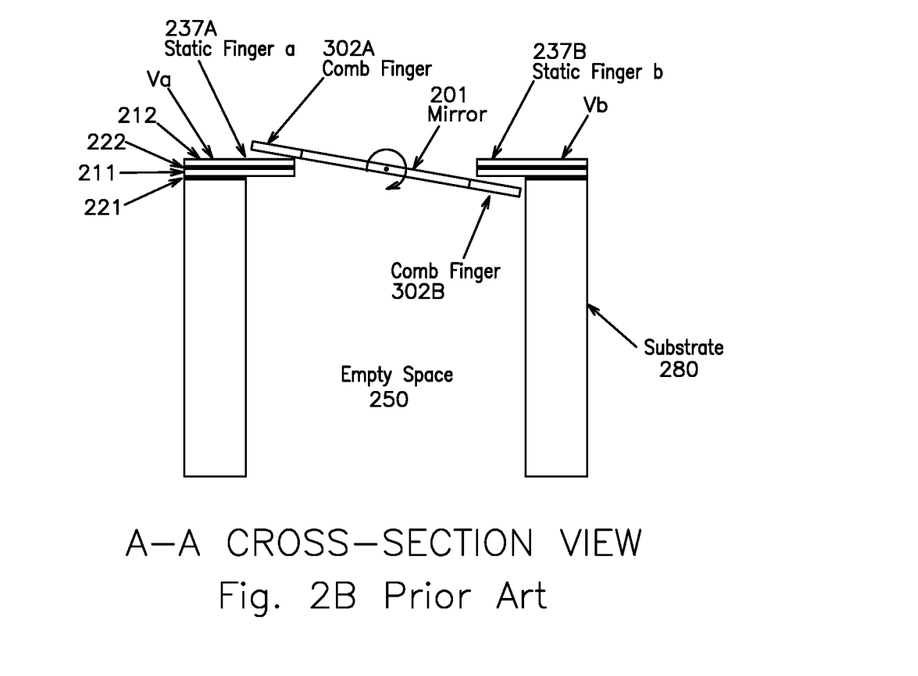
FIGS. 2B and 2C show cross-sectional views of the embodiment shown in FIG. 2A, taken at the A-A and B-B cut lines, respectively.
Figure 2C:
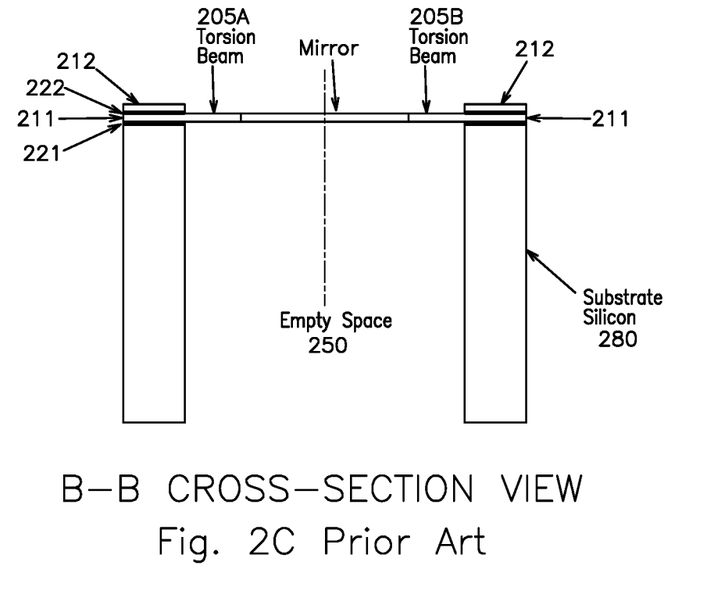

FIGS. 2A through 2C are used to illustrate a prior art rotating or tilting mirror structure with one rotational axis, fabricated using MEMS processes. Although the following discussion is described for embodiments using rotating or tilting mirror structure, such as used in an optical device, more generally the techniques described here can be used in other MEMS devices having a movable surface configured to rotate in response to a voltage differential applied to the MEMS device. FIG. 2A provides a conceptual top view of a single MEMS tilt-mirror device. FIGS. 2B and 2C provide cross-sectional views, taken at the cut lines labeled in FIG. 2A as A-A and B-B, respectively. The figures are not necessarily drawn to scale. Specifically, the vertical scale is exaggerated. Items or elements of the MEMS structure that appear in multiple views are labeled with the same label numbers in all views. The initial wafer is a double-layer SOI wafer, with two buried oxide layers. Mirror 201, its associated comb fingers 202A and 202B, and its associated torsion beams 205A and 205B, are all located in device layer 1, labeled as 211, which is lower than device layer 2, labeled as 212, as shown in the cross-section views of FIGS. 2B and 2C. The first buried oxide layer and the second buried oxide layer are indicated by 221 and 222, respectively. The stators 235A and 235B of the device's electrostatic actuators, as well as their associated static (fixed) comb fingers 237A and 237B, are in device layer 2, labeled as 212. Stator 235A and stator 235B are electrically isolated from each other, as well as from the mirror and its associated comb fingers. Device layer 1, labeled as 211, which contains the mirror 201 and its associated torsion beams and comb fingers, is held grounded. When a positive or negative voltage Va is applied to the stator 235A, the static comb fingers 237A electrostatically attract the mirror comb fingers 202A in an upward direction (causing a clockwise rotation around the axis of rotation of the device), and therefore the mirror is tilted, as shown in FIG. 2B. Note that the amount of tilt shown in FIG. 2B is exaggerated. Similarly, if a voltage Vb is applied to the stator 235B, the mirror will be rotated counter-clockwise (not shown).

During the fabrication of the MEMS structure shown in FIGS. 2A, 2B, and 2C, a relatively vast empty space or void region 250 (as shown in FIG. 2B) is opened through the silicon substrate 280 in order to expose or get access to the buried oxide layer 221, which is subsequently etched out to free the mirror 201, its associated comb fingers 202A and 202B, and the torsion beams, 205A and 205B. Thereafter, the movable surface is free to rotate along the rotational axis that is defined by the pair of torsion beams, 205 A and 205B, and can have a reflective surfaced formed or a mirror attached to its upper surface to form the mirror 201 of the primary embodiments described here.

In order to rotate the mirror 201 intentionally, such as for the purpose of steering an optical beam, a voltage Va or a voltage Vb is applied to the MEMS device. The precise tilt-angle of the mirror 201 is a function of the applied voltage. Intentional movement of the mirror is achieved by changing the applied voltage differential (Va or Vb). During and following the intentional rotational motion of the mirror, an under-damped oscillation of the mirror 201 may occur, before it settles to its destination angle, resulting from insufficient damping. If a light beam is shined on the mirror and reflected, the reflected beam will oscillate around a center point before settling down, which is unwanted for an optical device. Furthermore, external shock and vibrational forces may also result in unintended rotational motion of the mirror, which in turn may cause under-damped oscillation of the mirror. The embodiments described here are intended to create a damping mechanism to reduce the undesired oscillatory motion of the mirror.

Figure 3A:
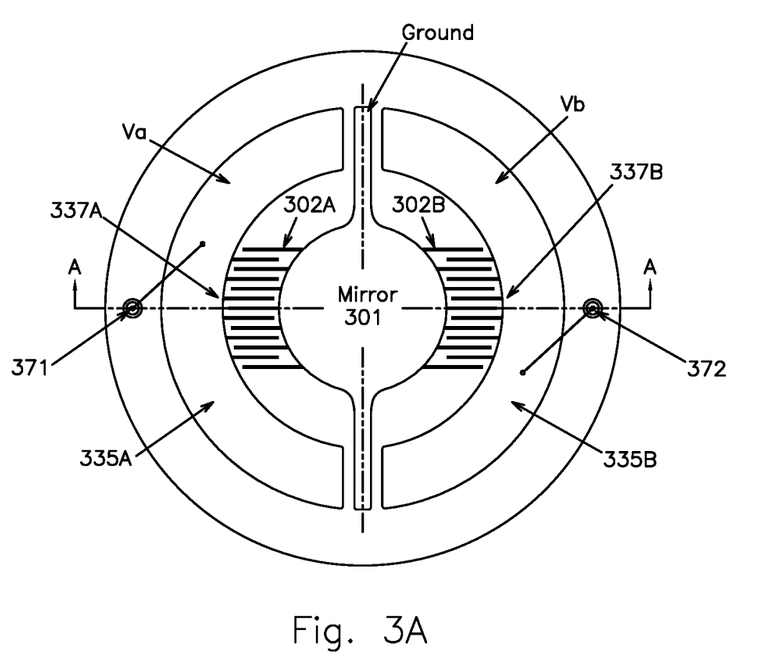
FIGS. 3A and 3B show the top view and a cross-sectional view of one embodiment in which a separate piece of material, or inlay block structure, is located directly underneath, and in close proximity to, the MEMS tilt-mirror.
Figure 3B:
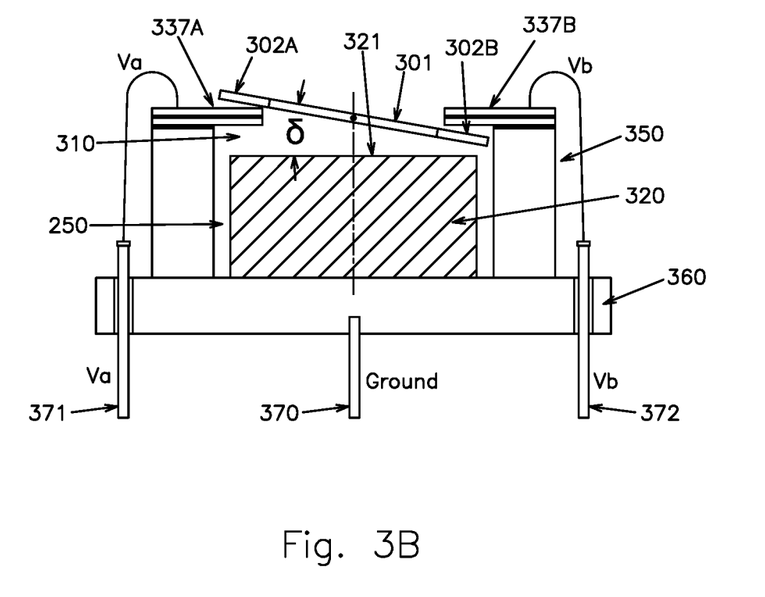

FIGS. 3A and 3B provide top and cross-sectional views, respectively, of one embodiment. The top view shown in FIG. 3A is largely the same as the top view shown in FIG. 2A. As shown in FIG. 3B, a block structure of an inlay block 320, which is foreign to the original MEMS structure 350, and can be made of any solid material such as semiconductors, transparent materials, metals, or even hard plastic, is filled or located into the empty space 250 that was also shown in FIG. 2B. The top surface 321 of the block structure 320 is brought in proximity to the mirror 301, as close to the mirror 301 as practical, but without touching the mirror 301, at any desired tilting position of the mirror 301. For example, the top of the block structure 320 can be planar and aligned with the bottom of the movable surface of the mirror 301 when it is in a "neutral" (i.e., no voltage differential applied to the MEMS structure) position. In other embodiments, the top of the block structure can have one or more slanted planar surfaces or be angled(or shaped) surfaces, to more closely follow the contours of the underside of the moving surface throughout its range of motion. In alternate embodiments, the damper block structure can be built in as a plateau from the header surface with a particular height by CNC (Computer Numeric Control) machining or punch. In this arrangement, the block structure can be a unitary portion of a header, although still separate from the MEMS structure.

For any of these embodiments, the block structure is configured so that a thin air channel 310, having an air gap δ that is on the order of a few microns to hundreds of microns, is created between the top surface 321 of inlay block 320, and the underside of the moving portion of the MEMS structure, including the mirror 301, as well as its associated comb fingers 302A and 302B. In some embodiments the mirror, or more generally the moving portion of the MEMS structure, can have an aperture in the center in order for light to pass directly through, or for mounting a thin optical element within (see, for example, U.S. patent application Ser. No. 15/655,534 and its discussion MEMS actuators). For embodiments including an aperture, the block structure can be of a transparent material, allowing light passed through the aperture to also pass through the block structure and on to any underlying elements, or to pass through a further aperture in the header.

For the various geometry variations described here, the moving portion is plate-like and referred to as "mirror 301" in the discussion given in this document. Because the moving structure may be tilted at an angle relative to the underside of the moving surface, the air gap of the air channel 310 will vary along the radial direction. When the mirror 301 is being rotated by changing applied voltage either Va or Vb, it will squeeze or suck the air, atmosphere, or gases in or out of the air channel 310. In general, the air, atmosphere, or gases will be compressed or squeezed by the downward motion of the mirror on one side of its rotational axis and will be sucked away by the upward motion of the mirror on the other side of its rotational axis. This aerodynamic motion of gases in a thin channel acts like a damper for the mirror's rotation. Similarly, the MEMS moving structure, while it is settled in a desired position by the application of a constant voltage, is made more resistive to external shock and vibrational forces being applied to it, because of the damping effect from the air channel 310. This damping effect is sometimes referred to as squeeze-film damping, or squeeze-air damping.

The ratio of the diameter of mirror 301 to the gap δ of the air channel 310, is on the order of tens or hundreds (to one). Thus, the aerodynamic friction to the mirror rotation can be made large enough such that the rotational or tilting motion of the mirror 301 will be critically damped, or even overdamped, in contrast to the underdamped case with no thin air channel. Therefore, the undesired oscillation of the mirror around the destination angle will quickly decay. One skilled in the art will recognize that the gases surrounding the MEMS device structure, and filling in the channel 310, are not necessarily air. Other gases are also within the scope of the description given here and may provide improved damping in comparison to air.

The block structure can be shaped or tuned to improve the damping characteristic. For example, the amount of gap extending away from the movable surface towards the header between the side walls of inlay block 320, and the support structure of the MEMS device, as indicated in FIG. 3B by item 250, may also have an effect on the amount of damping provided, as air will also be compressed or pulled out of these side gaps. The lateral dimensions of the inlay block 320 can be chosen to provide the desired or intended level of damping.

The inlay block structure 320 in FIG. 3B is shown with a flat top surface. However, inlay blocks with non-flat top surfaces can be used in other embodiments. If the MEMS tilt mirror is designed to tilt in only one direction (e.g., clockwise tilting, but not counter-clockwise), then the top surface of the inlay block 320 may be slanted, to more closely match the slant of the tilted mirror. This will minimize the size of the gap δ, between the underside of the tilt-mirror and the top surface of inlay block 320, at different locations under the mirror. If the MEMS mirror is designed to tilt bi-directionally (e.g., both clockwise tilting and counter-clockwise tilting), then the top surface of inlay block may have two slanted surfaces, with the highest points of the inlay block being directly underneath the rotational axis of the tilt-mirror. One skilled in the art will recognize that even more complex top surface shapes may be used for MEMS tilt-mirrors with two axes of rotation. Inlay blocks with slanted or shaped top surfaces can be used in other embodiments.

FIGS. 3A and 3B illustrate an embodiment of a MEMS structure having one axis of rotation. However, the use of MEMS mirrors or other tilt-surface structures having two rotational axes, fabricated from either double-layer or single-layer SOI wafers, as disclosed in U.S. Pat. Nos. 6,838,738 and 6,628,856, can also use the techniques described here, as long as there is a thin air channel between the moving structure and the top surface of the inlay block.

Figure 3C:
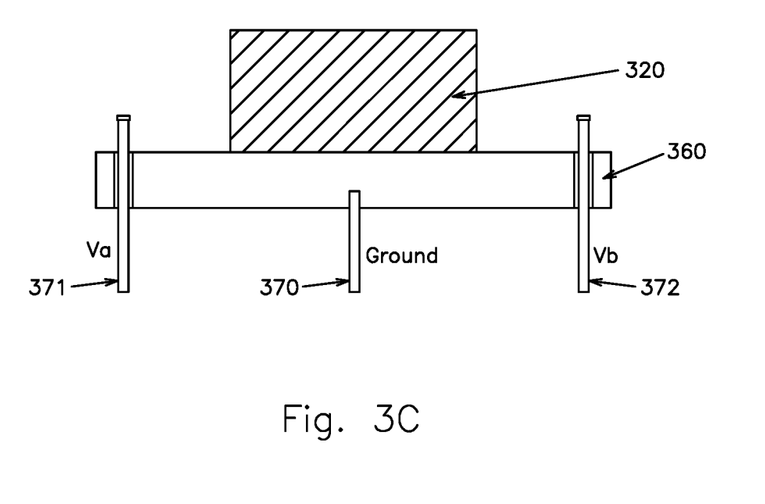
FIG. 3C shows one embodiment of the inlay block structure mounted on a chip header.

FIG. 3B also shows that both the inlay block structure 320 and the MEMS structure 350 are bonded to a chip header 360, such as a metal TO-can (Transistor Outline package) header. FIG. 3C shows the inlay block structure 320 bonded to chip header 360, without the MEMS structure. The number labels of the various elements shown in both figures are the same. Electrode pins 371 and 372 pass through the base of the chip header 360, but are electrically insulated from the header 360. These electrode pins are electrically connected via wire bonds to the stator 335A and the stator 335B, respectively, for applying voltages (and conducting electrostatic charge) to the static comb fingers 337A and 337B, respectively. The electrode pin 370 is electrically connected to the base of chip header 360 and is grounded, thereby grounding the top surface of the chip header 360, to which the MEMS structure 350 and the inlay block 320 are die-bonded.

Figure 4A:
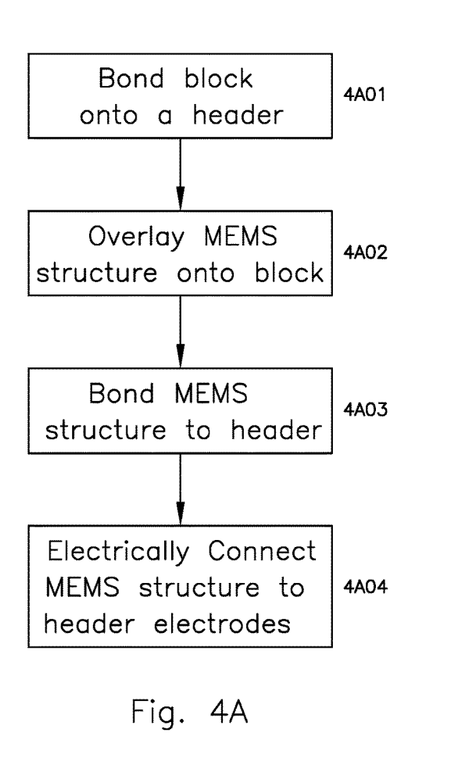
FIG. 4A illustrates the process flow of a method for one embodiment in which the inlay block is bonded to the chip header, prior to bonding of the MEMS structure to the chip header.
Figure 4B:
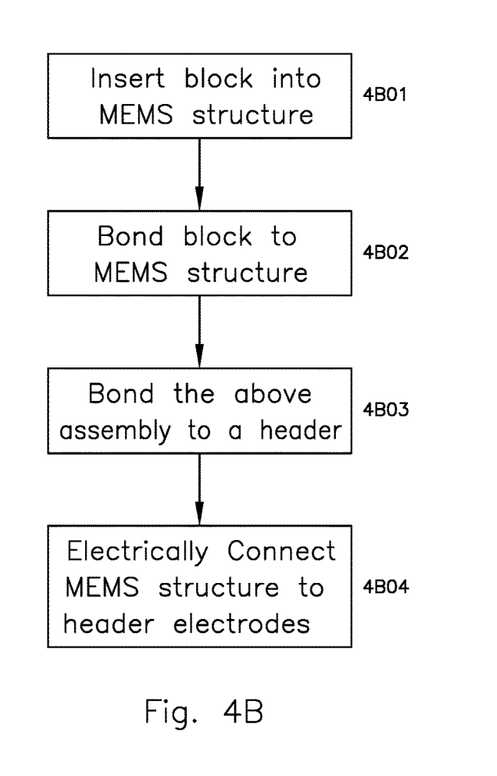
FIG. 4B illustrates the process flow of a method for another embodiment in which the inlay block is bonded to the underside of the MEMS structure, prior to the MEMS structure being bonded to the chip header.

FIGS. 4A and 4B depict flowchart describing two methods for assembling the MEMS structure 350 and inlay block structure 320 to the chip header 360. In the method of FIG. 4A, and in reference to FIGS. 3B and 3C, the inlay block structure 320 is first bonded to the chip header 360 at 4A01, either by epoxy or metal bond, or other bonding method. In other embodiments, the damping block structure 320 can be built in as a plateau from the header surface with a preset height by CNC (Computer numerical control) machining or punch, so that it is a unitary portion of the header 360.

At 4A02, the MEMS structure 350 is overlaid, or placed like a cap on the top of the inlay block structure 320. The MEMS structure 350 is then bonded to the chip header 360 at 4A03. Finally, at 4A04 the MEMS structure is electrically connected to the chip header electrodes 371 and 372, via wire-bonds, as shown in FIG. 3B.

In the embodiment of FIG. 4B, also in reference to FIGS. 3B and 3C, at 4B01 the inlay block structure 320 is first inserted into the void region of the empty space 250 and then bonded (at 4B02) inside the empty space or opening 250 at the underside of the MEMS structure 350, to form a single sub-assembly. For example, epoxy could be applied sparingly to the side walls of the inlay block structure 320, thereby bonding the block to the MEMS structure 350 along the sides of the block, well separated from the tilt-mirror and other moving portions of the MEMS structure.

At 4B03, the resulting sub-assembly is then die-attached or die-bonded to the chip header 360. Finally, at 4B04 the MEMS structure is electrically connected to the chip header electrodes 371 and 372, via wire bonds, as shown in FIG. 3B.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

It is claimed:

1. A method, comprising:
    forming a Micro-Electro-Mechanical-Systems (MEMS) structure, including:
        forming one or more layers upon a surface of a substrate;
        fabricating the one or more layers into a first stator, a second stator and a movable surface located between the first stator and second stators, the first stator, the second stator and the movable surface being electrically isolated from one another, and the movable surface configured to rotate in response to a voltage differential applied to the first and second stators;
        forming a void region in the substrate under the movable surface;
    attaching the MEMS structure to a chip header such that the void region is between the MEMS structure and the chip header; and
    locating an inlay block structure formed separately from both of the chip header and the MEMS structure within the void region, including:
        attaching the inlay block structure to one or both of the chip header and the MEMS structure such that the inlay block is proximate to, but not in contact with, the movable surface and configured to dampen rotational movement of the moveable surface.

2. The method of claim 1, wherein forming a void region in the substrate under the movable surface comprising:
    etching the substrate from a side opposite the surface of the substrate on which the one or more layers are formed.

3. The method of claim 1, wherein locating the inlay block structure within the void region further includes:
    prior to attaching the inlay block structure to one or both of chip header and MEMS structure, shaping the inlay block structure to improve rotational damping characteristics of the inlay block structure.

4. The method of claim 3, wherein shaping the inlay block structure to improve rotational damping characteristics of the inlay block structure includes:
    shaping the inlay block structure proximate to the movable surface to have a slanted surface relative to a surface of the chip header.

5. The method of claim 3, wherein shaping the inlay block structure to improve rotational damping characteristics of the inlay block structure includes:
    shaping the inlay block structure proximate to the movable surface to have two slanted surfaces relative to a surface of the chip header.

6. The method of claim 1, wherein locating the inlay block structure within the void region further includes:
    locating the inlay block structure such that an air gap is located in the void region that extends away from the movable surface towards the chip header.

7. The method of claim 1, wherein locating the inlay block structure within the void region further includes:
    attaching the inlay block structure to the chip header prior to attaching the MEMS structure to the chip header.

8. The method of claim 1, wherein locating the inlay block structure within the void region further includes:
    attaching the inlay block structure to the MEMS structure prior to attaching the MEMS structure to the chip header.

9. The method of claim 1, wherein forming the MEMS structure further includes:
    forming a reflective surface on the movable surface on a side opposite the void region.

10. The method of claim 1, wherein forming the MEMS structure further includes:
    attaching a mirror on the movable surface on a side opposite the void region.

11. The method of claim 1, further comprising:
    connecting to the first stator to a first electrode in the chip header; and
    connecting to the second stator to a second electrode in the chip header.

12. An apparatus, comprising:
    a Micro-Electro-Mechanical-Systems (MEMS) structure, comprising:
        a substrate;
        one or more layers formed upon the substrate, the one or more layers formed into:
            a first stator and a second stator; and
            a movable surface located between the first stator and second stators, the first stator, the second stator and the movable surface being electrically isolated from one another, and the movable surface configured to rotate in response to a voltage differential applied to the first and second stators; and
        a void region under the movable surface in the substrate;
    a chip header, the MEMS structure attached to the void region between the MEMS structure and the chip header; and
    an inlay block structure formed separately from both of the chip header and the MEMS structure, attached to one or both of the chip header and the MEMS structure such that the inlay block is proximate to but not in contact with the movable surface, and wherein the inlay block is configured to dampen rotational movement of the moveable surface.

13. The apparatus of claim 12, wherein the first stator is connected to a first electrode in the chip header and the second stator is connected to a second electrode in the chip header.

14. The apparatus of claim 12, wherein the inlay block structure includes, proximate to the movable surface, a surface slanted relative to a surface of the chip header.

15. The apparatus of claim 12, wherein the inlay block structure includes, proximate to the movable surface, two surfaces slanted relative to a surface of the chip header.

16. The apparatus of claim 12, wherein the apparatus is an optical device and the movable surface is mirrored on a side opposite the void region.

17. The apparatus of claim 12, wherein the first stator and the second stator each include a set of comb figures extending toward the movable surface, and the movable surface includes comb fingers extending toward both of the first stator and the second stator.

18. The apparatus of claim 12, wherein the inlay block structure is attached to one or both of the chip header and the MEMS structure to leave an air gap in the void region that extends away from the movable surface towards the header.

19. The apparatus of claim 12, wherein the inlay block structure is bonded to the MEMS structure.

20. The apparatus of claim 12, wherein the inlay block structure is bonded to the chip header.

21. The apparatus of claim 12, wherein the inlay block structure is formed of a semiconductor material.

22. The apparatus of claim 12, wherein the inlay block structure is formed of a metal.

23. The apparatus of claim 12, wherein the inlay block structure is formed of a glass material.

* * * * *